United States Patent [19]

Bird et al.

[11] Patent Number: 5,426,292

[45] Date of Patent: Jun. 20, 1995

[54] IMAGE SENSOR HAVING A TWO DIMENSIONAL ARRAY OF IMAGING ELEMENTS WITH OPPOSITE POLARITY LEAKAGE CURRENTS

[75] Inventors: Neil C. Bird, Horley; Cornelis Van Berkel, Hove, both of England

[73] Assignee: U. S. Philips Corporation, New York, N.Y.

[21] Appl. No.: 228,468

[22] Filed: Apr. 15, 1994

[30] Foreign Application Priority Data

Apr. 24, 1993 [GB] United Kingdom ............... 9308543

[51] Int. Cl.$^6$ .......................................... H01J 40/14
[52] U.S. Cl. ............................. 250/208.1; 257/443; 348/308
[58] Field of Search ........... 250/208.1, 214.1, 214 LS; 257/443-445; 348/302, 307-309

[56] References Cited

U.S. PATENT DOCUMENTS

| | | | |
|---|---|---|---|
| 4,945,242 | 7/1990 | Berger et al. | 250/367 |
| 4,945,419 | 7/1990 | Arques | 348/309 |
| 5,371,351 | 12/1994 | Van Berkel | 250/208.1 |

FOREIGN PATENT DOCUMENTS

| | | |
|---|---|---|
| 0154962 | 9/1985 | European Pat. Off. . |
| 0233104 | 8/1987 | European Pat. Off. . |

OTHER PUBLICATIONS

"Microlens Arrays" Hutley et al, Physics World, Jul. 1991, pp. 27-32.

Primary Examiner—David C. Nelms
Assistant Examiner—Que T. Le
Attorney, Agent, or Firm—Michael J. Balconi-Lamica

[57] ABSTRACT

A two-dimensional array (2) of imaging elements (3) is arranged in rows and columns. Each imaging element (3) has a two terminal component (40) for sensing light incident on the imaging element and for storing charge representing the incident light. A plurality of row and column conductors (5 and 6) are provided with one of the two terminals (4a,4b) of each component (40) in a row being coupled to the associated row conductor (5) and the other one of the two terminals (4a,4b) to the associated column conductor (6). Voltage signals are applied to the row and column conductors (5 and 6) for enabling the components (40) to sense light incident on the array (2) and to enable charge stored at a selected imaging element (3) to be sensed. The rows of imaging elements (3) are arranged in first and second sets (S1 and S2). A voltage signal of one polarity is applied to a row conductor (5) associated with the first set (S1) to enable charge stored at an imaging element (3) in the associated row (5) to be sensed. A voltage of the opposite polarity is applied to a row conductor (5) associated with the second set (S2) to enable charge stored at an imaging element (3) in the associated row (5) to be sensed. The leakage currents from rows in the first set (S1) of rows will thus be of opposite polarity to the leakage currents from rows in the second set (S2) so reducing the overall leakage current and thus the vertical cross-talk between rows.

9 Claims, 4 Drawing Sheets

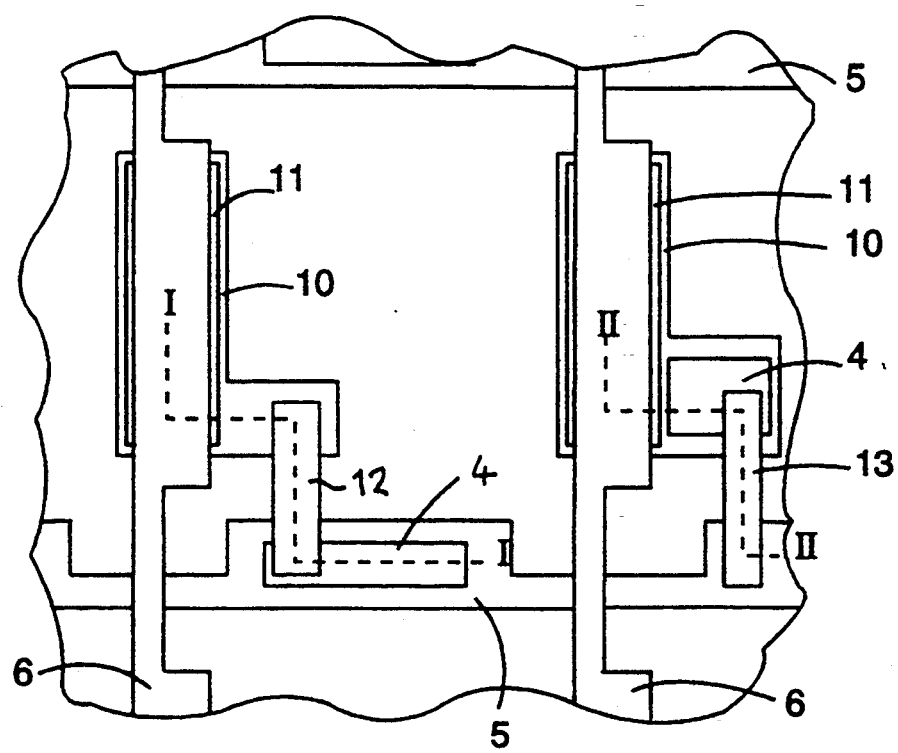
FIG. 3
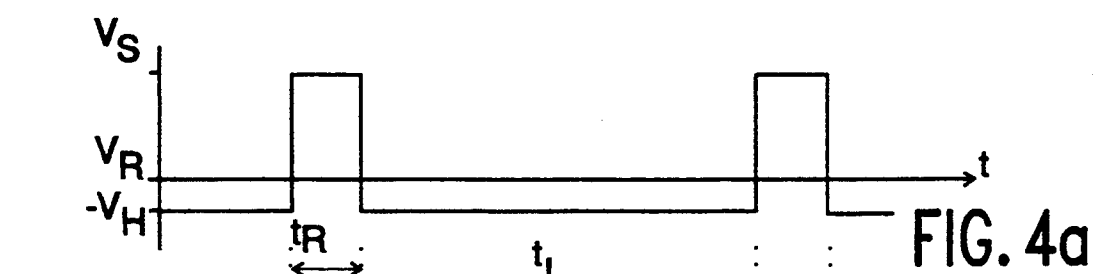
FIG. 4a
FIG. 4b
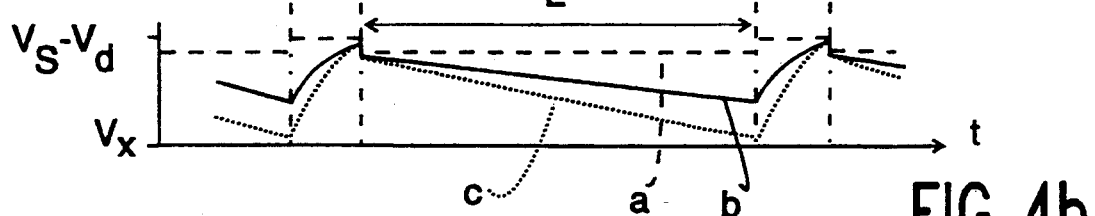
FIG. 4c
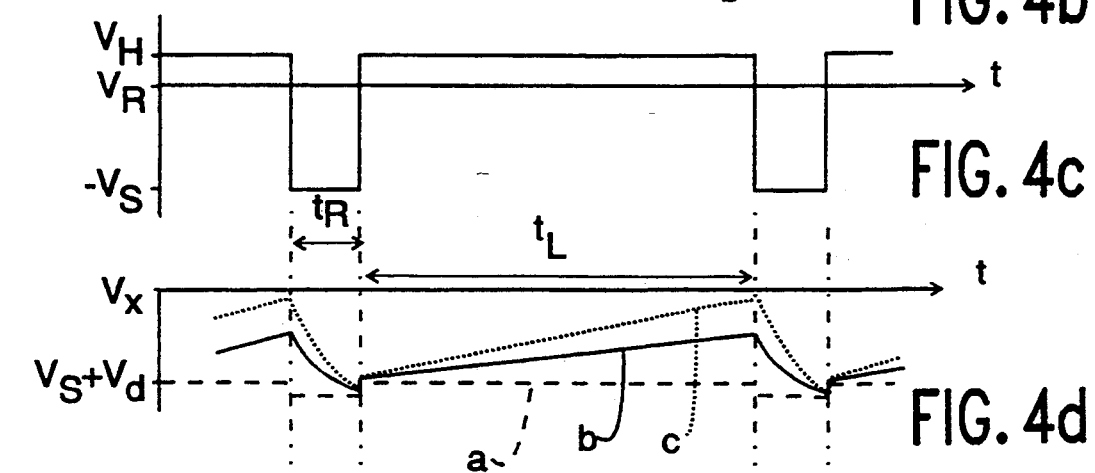
FIG. 4d

IMAGE SENSOR HAVING A TWO DIMENSIONAL ARRAY OF IMAGING ELEMENTS WITH OPPOSITE POLARITY LEAKAGE CURRENTS

BACKGROUND OF THE INVENTION

This invention relates to an image sensor, in particular an image sensor comprising a two-dimensional.

EP-A-233104 and U.S. Pat. No. 4,945,242 describe image sensors comprising a two-dimensional array of imaging elements arranged in rows and columns with each imaging element comprising a two terminal component for sensing light incident on the imaging element and for storing charge representing the incident light and a cathode electrode, and a plurality of row and column conductors with one of the two terminals of each component in a row being coupled to the associated row conductor and the other one of the two terminals being coupled to the associated column conductor, and means for applying voltage signals to the row and column conductors for enabling light incident on the array to be sensed and to enable charge stored at a selected imaging element to be sensed.

A problem with such an image sensor is that during read-out of the charge stored at a selected pixel or imaging element, a leakage current also flows in unselected pixels and so there is a high vertical cross-talk between pixels. One solution to this problem is to ensure that the image sensor is receiving no illumination when the charge stored at the imaging elements is being read-out. Where the image sensor operates by illuminating an object to be imaged, for example a document, this can be achieved by switching the illuminating light source on and off. However there are situations where light will inevitably be falling on the array during readout of the stored charge, for example when the array is viewing a scene rather than a document, and then illuminations cannot be avoided without placing a shutter or aperture in front of the image sensor.

SUMMARY OF THE INVENTION

According to the present invention, there is provided an image sensor comprising a two-dimensional array of imaging elements arranged in rows and columns with each imaging element comprising a two terminal component for sensing light incident on the imaging element and for storing charge representing the incident light and a cathode electrode, and a plurality of row and column conductors with one of the two terminals of each component in a row being coupled to the associated row conductor and the other one of the two terminals being coupled to the associated column conductor, and means for applying voltage signals to the row and column conductors for enabling light incident on the array to be sensed and to enable charge stored at a selected imaging element to be sensed, characterised in that the rows of imaging elements are arranged in first and second sets and in that the means for applying voltage signals to the row and column conductors comprises means for applying a voltage of one polarity to a row conductor associated with the first set to enable charge stored at an imaging element in the associated row to be sensed and for applying a voltage of the opposite polarity to a row conductor associated with the second set to enable charge stored at an imaging element in the associated row Lo be sensed.

In such an image sensor, the leakage currents from rows in the first set of rows of imaging elements will be of opposite polarity to the leakage currents from rows in the second set of rows of imaging elements, thereby resulting in a reduction in the overall leakage current and thus in the vertical cross-talk between rows.

The first and second sets may comprise equal numbers of rows of imaging elements which should facilitate a reduction in the leakage current. Preferably, the first set consists of alternate rows of imaging elements and the second set consists of the remaining rows of imaging elements. This should be particularly advantageous because adjacent pixels or imaging elements are more likely to receive similar levels of illumination and so the associated leakage currents are more likely to be of similar value. Thus, where adjacent rows have opposite polarity leakage currents, the resultant overall leakage current should be considerably reduced.

In one example each two terminal component comprises a photosensitive rectifying device having an anode electrode and a cathode electrode and the anode electrodes of the rectifying devices of the rows of imaging elements in the first set are coupled to the associated row conductor while the cathode electrodes of the rectifying devices of the rows of imaging elements in the second set are coupled to the associated row conductor.

Each two-terminal component may comprise any suitable form of photosensitive device. The photosensitive device could be, for example, a photosensitive rectifying device as in the above example or a non linear resistive device such as a thin film diode or MIM. Where photosensitive rectifying devices are used then they may be, for example, photosensitive diodes such as p-i-n or Schottky diodes.

In another example, each imaging element comprises first and second rectifying devices coupled back to back with the first rectifying devices forming the photosensitive rectifying devices and so that the cathode electrodes of the first and second rectifying devices of an imaging element in one of the first and second sets are coupled together while the anode electrodes of the first and second rectifying devices of an imaging element in the other of the first and second sets are coupled together. Generally, the first and second rectifying devices comprise diodes with the first rectifying devices being photosensitive.

An image sensor in accordance with the invention may be formed using thin film technology. At least some of the photosensitive devices may be formed on the associated row or column conductor.

BRIEF DESCRIPTION OF THE DRAWINGS

Embodiments of the invention will now be described, by way of example, with reference to the accompanying drawings, in which:

FIG. 3 is a plan view of one imaging element for each of two adjacent rows of the image sensor shown in FIG. 1 for illustrating a possible layout for the image sensor shown in FIG. 1;

FIGS. 4a–4d illustrate the voltage signals applied to access imaging elements in adjacent rows of the image sensor shown in FIG. 1.

It should of course be understood that the drawings are merely schematic and are not to scale. Like reference numerals are used throughout the drawings to refer to like parts.

DETAILED DESCRIPTION OF THE PREFERRED EMBODIMENTS

Figure 1:
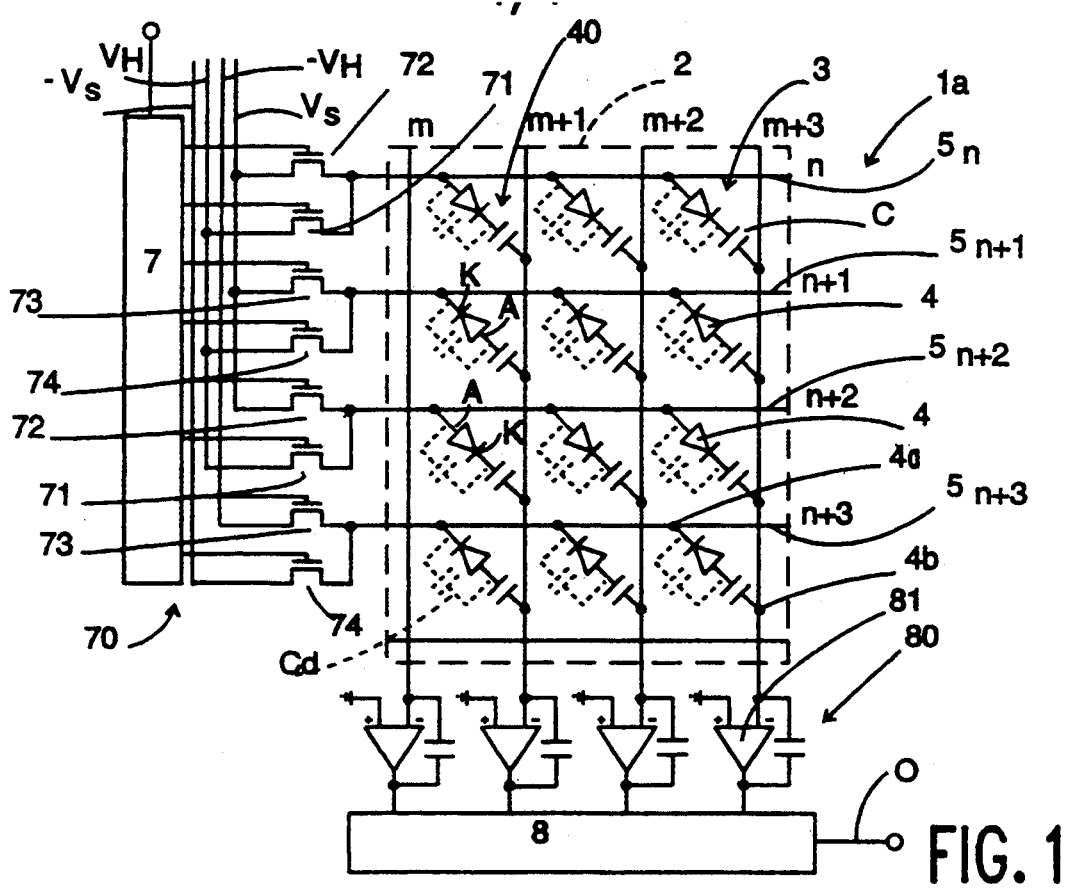
FIG. 1 is a schematic circuit diagram illustrating one example of an image sensor in accordance with the invention.

Referring now to the drawings, there are illustrated various examples of image sensors 1a, 1b ... comprising a two-dimensional array 2 of imaging elements 3 arranged in rows and columns with each imaging element 3 comprising a two terminal component 40 for sensing light incident on the imaging element and for storing charge representing the incident light, and a plurality of row and column conductors 5 and 6 with one of the two terminals 4a, 4b of each component 40 in a row being coupled to the associated row conductor 5 and the other one of the two terminals 4a, 4b to the associated column conductor 6, and means 7 and 8 for applying voltage signals to the row and column conductors 5 and 6 for enabling light incident on the array 2 to be sensed and to enable charge stored at a selected imaging element 3 to be sensed. In accordance with the invention, the rows of imaging elements 3 are arranged in first and second sets S1 and S2 and the means for applying voltage signals to the row and column conductors 5 and 6 comprises means for applying a voltage signal of one polarity to a row conductor 5 associated with the first set S1 to enable charge stored at an imaging element 3 in the associated row 5 to be sensed and for applying a voltage of the opposite polarity to a row conductor 5 associated with the second set S2 to enable charge stored at an imaging element 3 in the associated row 5 to be sensed.

In such an image sensor, the leakage currents from rows in the first set S1 of rows of imaging elements 3 will be of opposite polarity to the leakage currents from rows in the second set S2 of rows of imaging elements 3 thereby resulting in a reduction in the overall leakage current and thus in the vertical cross-talk between rows.

The array 2 shown in FIG. 1 consists of a matrix of four row conductors 5 and four column conductors 6 defining a grid of four rows n, n+1, n+2, n+3 and three columns m, m+1, m+2, m+3 of imaging elements 4 each bounded by two adjacent pairs of row and column conductors 5 and 6.

Although the array 2 shown in FIG. 1 consists only of four rows n, n+1, n+2, n+3 and four columns m, m+1, m+2, m+3 of imaging elements 3, generally an image sensor in accordance with the invention will have an array formed of many more imaging elements. The actual number of imaging elements will of course depend upon the intended application of the image sensor, in particular upon the size of area to be imaged and the desired resolution of the obtained image. Where, for example, the image sensor is desired to be able to image a page of typescript, then the array may have a size equivalent to an A4 page and the imaging elements 3 may have a pitch of about 100 μm (micrometres).

In the example shown in FIG. 1, each two terminal component 40 consists of a photosensitive rectifying device 4 in the form of a photosensitive diode in series with a capacitor C. Although FIG. 1 shows the photosensitive diodes 4 as connected directly to the associated row conductor 5, the positions of the photosensitive diodes 4 and capacitors C could be reversed so that each photosensitive diode 4 is coupled to the associated row conductor 5 via the associated capacitor C.

Each photosensitive diode 4 has an intrinsic capacitance illustrated by way of an additional capacitor Cd shown in phantom lines in parallel with the associated photosensitive diode 4 in FIG. 1.

The photosensitive rectifying devices 4 in the first and second sets S1 and S2 are oppositely oriented so that the anode electrodes A of the photosensitive rectifying devices 4 in the first set S1 are coupled to the associated row conductor 5 while the cathode electrodes K of the photosensitive rectifying devices 4 in the second set S2 are coupled to the associated row conductor 5. In the specific example shown in FIG. 1 photosensitive diodes 4 in adjacent rows are oppositely oriented so that rows n, n+2 ... form the first set S1 and rows n+1, n+3 ... form the second set S2. Thus, in the example illustrated, the anode electrodes A of the photosensitive diodes 4' in the first set S1 of rows n, n+2 are coupled, in this case directly connected, to the associated row conductor 5n, 5n+2 ... while the cathode electrodes K of the photosensitive diodes 4" in the second set S2 of rows n+1, n+3 are coupled, in this case directly connected, to the associated row conductor $5_{n+1}$, $5_{n+3}$. The other electrode of each photosensitive diode 4 is connected via the associated capacitor C to the associated column conductor 6.

Each row conductor $5_n, 5_{n+2}$ of the first set S1 is connected to a row driver arrangement 70 via one main electrode of each of two respective switching transistors 71 and 72 while each row conductor $5_{n+1}, 5_{n+3}$ of the second set S2 is connected to the row driver arrangement 70 via one main electrode of each of two respective switching transistors 73 and 74. The transistors may be thin film transistors. The gate of each switching transistor 71, 72, 73, 74 is connected to a shift register and decoder circuit 7 while the other main electrodes of the switching transistor 71, 72, 73 and 74 are connected to first, second third and fourth conductors 71a, 72a, 73a and 74a, respectively. The shift register and decoder circuit 7, by activating the appropriate transistors 71 to 74 under the control of clock signals applied to the circuit 7 allows voltage signals supplied to the conductors 71a to 74a to be applied to the row conductors 7.

The column conductors 6 are each connected via a respective charge sensitive amplifier 81 to an output shift register and decoder circuit 8 from which image signals may be supplied via an output 0 to an appropriate store or to a display.

Each charge sensitive amplifier 81 has its output connected to its negative input 81 and serves to convert a current supplied through the associated column conductor 6 during readout of stored charge into a voltage output. The positive inputs of the charge sensitive amplifiers 80 are connected to ground or any suitable fixed reference potential.

Any suitable arrangement could be used for detecting the photocurrent passing down a column and providing an appropriate output signal, for example an arrangement as described in U.S. Pat. No. 4,945,242.

Although the image sensor 1a may be of any suitable construction, in this example, the image sensor 1a is formed using thin film technology on a suitable transparent insulating substrate. Where the image sensor is to be used, for example, for contact imaging and back-illumination the substrate should of course be transparent to electromagnetic radiation within the range of wavelengths (generally the visible part of the spectrum) to which the diodes 4 are sensitive.

The row and column driver arrangements 70 and 80 may be formed on separate substrates from (or around the periphery of) the array 2 and may be, for example, in the form of polycrystalline silicon thin film transistor circuitry.

Figure 2A:
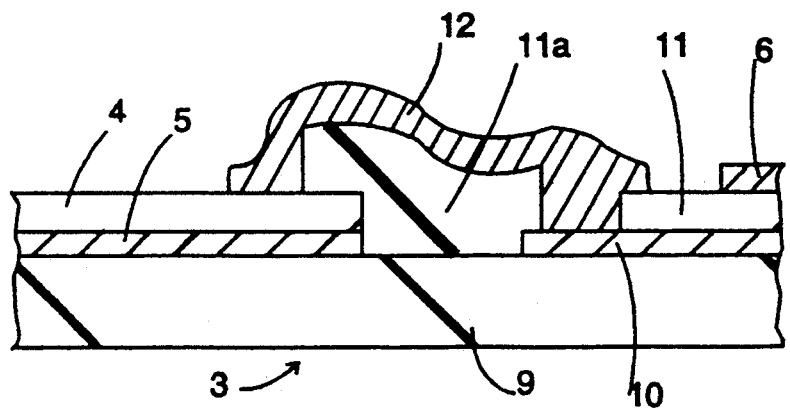
FIGS. 2a and 2b are cross-sectional views through parts of imaging elements of adjacent rows of the image sensor illustrated in FIG. 1.
Figure 2B:
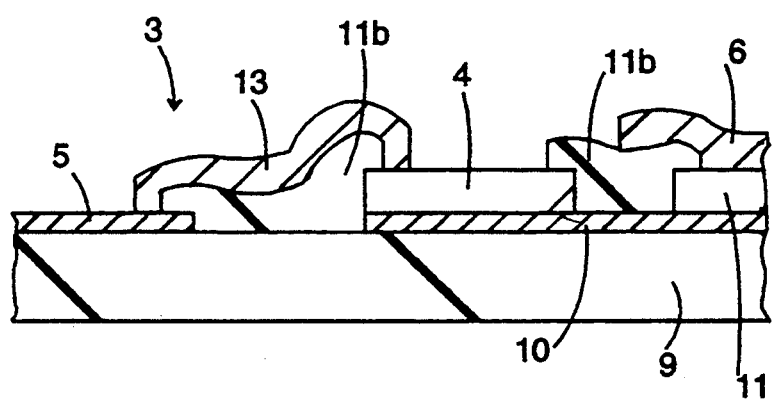

FIGS. 2a, 2b and 3 show respectively cross-sectional views and a schematic layout for illustrating one possible construction for the image sensor shown in FIG. 1.

FIG. 2a is a cross-sectional view through part of an imaging element of a row of the second set S2 and taken along the line I—I in FIG. 3 while FIG. 2b is a cross-sectional view through part of an imaging element of a row of the first set S1 and taken along the line II—II in FIG. 3.

The transparent substrate 9 is generally formed from a suitable glass or plastics material and the photosensitive diodes 4, capacitors C and row and column conductors 5 and 6 are formed on the transparent substrate 9 by the deposition and patterning of thin films.

Although the layers for forming all rows of imaging elements 3 will in so far as possible be formed and patterned simultaneously, for ease of explanation the formation of an imaging element as shown in FIG. 2a for the second set S2 of rows will be described separately from the formation of an imaging element 3 of the first set S1 of rows as illustrated in FIG. 2b.

Thus, referring to FIG. 2a, a first layer of electrically conductive material is deposited onto the substrate 9 to define at least part of the row conductors 5 integrally with the cathode electrodes K of the photosensitive diodes 4 and electrodes 10 for the associated capacitors C. Generally, the first conductive layer is a chrome layer with a typical thickness of from about 70 nm to about 100 nm (nanometres).

In this example, the photosensitive diodes 4 are formed as amorphous silicon n-i-p diodes by depositing in sequence n conductivity, intrinsic conductivity and p conductivity layers. These layers are then patterned to define the diode structures as shown in FIG. 2a. An insulating layer, generally a silicon nitride layer, is then deposited and patterned to define the dielectric regions 11 of the capacitors on top of the electrodes 10 and insulating regions 11a. A second layer of conductive material, generally chromium followed by a further layer of a more highly conductive material such as aluminium, is then deposited and patterned to define on the capacitor dielectric regions 11 at least part of the column conductors 6 and for each imaging element 3 an interconnecting electrode 12 which both forms the anode electrode A and connects the anode of the photosensitive diode 4 to the electrode 10 of the associated capacitor. A transparent passivating layer, such as a polyimide, may be provided over the completed structure.

As can be seen most clearly from FIG. 3, the fact that the capacitors C and photosensitive diodes 4 are formed virtually entirely on top of the row and/or column electrodes means that array can be formed so as to be virtually completely transparent with effectively only the row and column conductors 5 obscuring the passage of light through the image sensor 1a. In addition, the opaque row conductors 5 serve to shield the photosensitive diodes from light that is incident on the substrate 9. Both these features can present considerable advantages for certain applications of the image sensor as will be explained hereinafter.

In order to form the imaging elements 3 of the first set S1 of rows n, n+2 ... it is for course necessary to in some way or other reverse the direction of the photosensitive diodes 4. This could be done by forming the layers of the photosensitive diodes 4 of the first set S1 in the reverse order to the layers of the photosensitive diode 4 of the second set S2, that is by forming first the p then the intrinsic and then the n conductivity regions. This can be achieved by depositing each amorphous silicon layer as an intrinsic layer and then doping the appropriate regions in known manner using appropriate masks.

If the photosensitive diodes 4 of the first set S1 are indeed formed in reverse order, one set as n-i-p and one set as p-i-n diodes, then all of the imaging elements 3 may have the structure shown in FIG. 2a.

As one possible alternative, all of the photosensitive diodes 4 may be formed as n-i-p diodes and the interconnections with the row and column conductors 5 and 6 and the capacitors C altered accordingly as illustrated in FIG. 2B.

Thus, in the example illustrated in FIG. 2B, the n-i-p photosensitive diodes 4 are formed on top of the electrodes 10 and the patterning of the subsequent insulating layer defines insulating regions 11b and the dielectric regions 11 of the capacitors C on the electrodes 10. The electrodes 10 thus form the cathode electrodes K of the photosensitive diodes 4.

The second conductive layer is patterned to define at least part of the column conductors 6 and an interconnecting electrode 13 with each interconnecting electrode 13 forming the anode electrode A of the associated photosensitive diode 4 and connecting the associated row conductor 5 to the photosensitive diode 4.

As can be seen from FIG. 3, although this enables all the photosensitive diodes 4 to have the same n-i-p structure necessarily the photosensitive diodes 4 cannot be formed on top of the row electrodes 5 and so an additional amount of the area of the imaging element is taken up by the area occupied by the photosensitive diode 4 and the underlying opaque electrode 10.

The operation of the image sensor 1a will now be described with reference to the timing diagrams shown in FIGS. 4a to 4d.

FIG. 4a illustrates the change with time in the voltage applied to one of the first set S1 of rows n, n+2 .. . in which the anode electrodes A of the photosensitive diodes 4 are connected to the associated row conductor 5 while FIG. 4b illustrates the corresponding change in the voltage at the mid point M of the imaging element or pixel 3, that is at the junction between the cathode electrode K of the photosensitive diodes 4 and the capacitor C.

FIG. 4c illustrates the change with time in the voltage applied to one of the second set S2 of rows n+1, n+3 ... in which the cathode electrodes K of the photosensitive diodes 4 are connected to the associated row conductor 5 while FIG. 4d illustrates the corresponding change in the voltage at the midpoint M of the imaging element or pixel 3, that is at the junction between the anode electrode A of the photosensitive diodes 4 and the capacitor C.

As should be evident from a comparison of FIGS. 4a and 4c, the rows n, n+1, n+2 ... of rectifying devices 4 are accessed in sequence to enable read-out of the charge stored at the imaging elements 3. The columns are generally accessed, via the column conductors 6 and charge sensitive amplifiers simultaneously using the column readout circuitry 8 so that the information is read out a row at a time.

In the image sensor 1a illustrated in FIG. 1, the rectifying devices 4 act both as the photosensitive elements of the image sensor and as switching elements. When an imaging element or pixel 3 is sensing incident electromagnetic radiation or light, the associated diode 4 must be reverse-biassed. Charge generated by the diode is stored on the total imaging element capacitance within the sum of the capacitance of the capacitor C and the intrinsic capacitance Cd of the photosensitive diode 4. When a voltage of the appropriate polarity, as will be explained in greater detail below, is applied to the associated row conductor 5, the diode becomes forward-biassed and recharges the capacitor C to its original value. When the row voltage falls, the diode 4 is again reverse-biassed and photogenerated charge is stored in the imaging element.

In order to explain in greater detail the operation of the image sensor 1a, the situation at a time $t_x$ will first be considered for a photosensitive diode of a row n, n+2 of photosensitive diodes 4 of the first set S1 having their anode electrodes connected to the associated row conductor 5. Thus referring to FIGS. 4a and 4b, time $t_x$, represents the end of a read-out period $t_R$ during which the photosensitive diode 4 has been forward-biassed to enable the charge previously stored at the imaging element or pixel 4 to be read out.

At the end of the read-out period $t_R$ the transistors 72 will be conducting and the row voltage will be $V_s$ (where $V_s$ is the row read-out select voltage) and the photosensitive diode 4 will have just finished charging the capacitor C. The voltage $V_x$ at the midpoint M, that is at the junction between the photosensitive diode 4 and the capacitor C, of the pixel 3 will be $$V_x = V_s - V_d \quad \text{1)}$$

where $V_d$ is the voltage dropped across the photosensitive diode 4 at the end of the row select period $t_R$. The associated column conductor 6 is a virtual earth because it is connected to the input of the charge sensitive amplifier.

At the end of the read-out period $t_R$, the transistors 72 are switched off and the transistors 71 rendered conducting so that the row voltage changes to $V_H$ where $V_H$ is the holding voltage for an unselected row, and the voltage $V_x$ at the midpoint M changes to:

$$V_x = V_s - V_d - (V_s - V_H)\frac{Cd}{Cd + C} \quad \text{2)}$$

The row voltages $V_s$ and $V_H$ are selected such that the photosensitive diode 4 is reverse-biassed at the start of the light-detection or integration period $t_L$ which follows the read-out period $t_R$.

If during the integration period $t_L$ light is incident on the photosensitive diode 4, electrons and holes will be photogenerated within the photosensitive diode 4 causing a photocurrent $i_p$ which begins to discharge the diode self-capacitance Cd and to charge the storage capacitor C.

For a photocurrent $i_p$, then the rate of change in the voltage at the midpoint M will be $$\frac{dV_x}{dt} = \frac{-i_p}{(C + Cd)} \quad \text{3)}$$

and at the end of the integration period $t_L$ the voltage $V_x$ will be $$V_x = V_s - V_D - (V_s - V_H)\frac{Cd}{Cd + c} - \frac{i_p T_L}{(Cd + C)} \quad \text{4)}$$

FIG. 4b shows the change in the voltage $V_x$ with time during the integration period $t_L$ for three different situations. Thus, the dashed line a indicates the situation where the photosensitive diode 4 is not illuminated, the solid line b indicates the situation for a moderate amount of illumination and the dotted line C indicates the situation when the photosensitive diode 4 is under maximum illumination, that is the situation when the photosensitive diode 4 is just about to go into the photovoltaic mode, that is the photosensitive diode 4 is just about to become forward-biassed.

At the end of the integration period $t_L$, the row voltage is changed to the positive read-out select voltage $V_s$ so forward-biassing the photosensitive diode 4. The capacitive coupling causes $V_x$ to become more positive and the forward current from the photosensitive diode 4 recharges the capacitor C until $V_x = V_s - V_d$ again.

During the read-out operation $V_x$ changes by $$\Delta V_x = \frac{i_p t_L}{Cd + C} \quad \text{5)}$$

and the accessible charge produced by the imaging elements or pixel 3 is that which flows through the capacitor C down the column conductor 5 to the charge sensitive amplifier. The charge $q_p$ from a selected pixel 3 is given by:

$$q_p = C \Delta V_x = i_p t_L \frac{C}{(Cd + C)} \quad \text{6)}$$

If all of the photosensitive diodes 4 in all of the rows n, n+1, n+2, were similarly oriented, that is in this example they had their anodes connected to the row conductor 5, then during the read-out period $t_R$ for a selected imaging element 3 of a selected row, the other unselected imaging elements 3 in the same column will contribute a leakage current to the current sensed by the charge sense amplifier 7. To give an idea for the size of the problem, if all imaging elements 3 of the selected column were uniformly illuminated then each unselected imaging element or pixel 3 will contribute an amount of charge $q_L$ equivalent to:

$$q_L = -i_p t_L \frac{C}{Cd + C} \quad \text{7)}$$

If we assume that the frame time (time to read all pixels?) is $Mt_L$, the rows are read out successively and continuously and the number of rows is N, then under uniform illumination, the ratio of signal charge to leaked charge would be:

$$\frac{q_p}{q_L} = \frac{M}{N}$$

if all of the photosensitive diodes 4 were similarly oriented.

However, in the image sensor 1a, the polarity of the voltages applied to the row conductors 5 during the read-out period $t_R$ and the integration period $t_L$ are reversed for alternate rows of the array 2 with alternate rows having their photosensitive diodes 4 oppositely oriented so that the photosensitive diodes 4 of rows n+1, n+3 etc. have their cathodes electrodes K rather than their anode electrodes A connected to the associated row conductor 5. In effect the signs in the equations 1) to 7) above are all reversed for the second set S2 so that for the second set S2 of alternate rows n+1, n+3 ... the corresponding equations are:

$$V_x = -V_s + V_d \quad 1')$$

at the end of the read-out period $t_R$ when the transistors 74 are conducting and the voltage $-V_s$ is applied to the row conductors. When the row voltage changes to $V_H$, that is when the transistors 73 are rendered conducting, at the start of the integration period $t_L$, then $V'_x$ changes to:

$$V_x = -V_s + V_d + (V_H + V_s)\frac{Cd}{Cd + C} \quad 2')$$

and at the end of the integration period $t_L$ the voltage $V'_x$ will be:

$$V_x = -V_s + V_d + (V_H + V_s)\frac{Cd}{Cd + C} + \frac{i_p t_L}{Cd + C} \quad 4')$$

and accessible charge which flows down the associated column conductor 5 to the charge sensitive amplifier 81 from a selected pixel will be:

$$q'_p = C \Delta V_x = -i_p t_L \frac{C}{Cd + C} \quad 6')$$

and the leakage current from unselected imaging elements or pixels 3a the same column will be:

$$q'_L = i_p t_L \frac{C}{Cd + C} \quad 7')$$

The leakage current from the second set S2 of rows n+1, n+3 is thus of the opposite sign to the leakage current from the first set S1 of rows n, n+2, ... and if the intensity of light falling on adjacent pixels 3 in the same column is identical, the leakage charges will completely cancel out. Variations in the light intensity across adjacent pixels 3 will result in some leakage but in virtually all cases, the leakage charge will be significantly reduced. Even in an extreme situation where the image consists of two horizontal bands of black and white, the leakage charge will cancel out except for the two pixels at the intersection of the black and white bands. In comparison, in an array where all the photosensitive diodes 4 are oriented in the same direction, the signal to leakage ratio for the same black and white band image would be 50%.

The amount of leakage current (or vertical cross-talk) can be further reduced by increasing the frame time $t_F$ so that $$t_F = Mt_R$$

$t_L = (M-1)t_R$ where N is the number of rows and M is N plus a predetermined time delay consisting of an integral number times $t_R$.

With such an arrangement, each row 5 of the array 2 is read-out in sequence (constituting a single frame) and then there is a delay of $(M-N)t_R$ before the rows are read-out again. This effectively increases the amount of charge stored at the photosensitive diodes because of the longer time between successive read-outs and so should improve the signal to leakage charge ratio.

Although applying opposite polarity voltages to, and orienting the photosensitive diodes 4 in opposite directions in, alternate rows has advantages in that it is more likely that adjacent pixels 3 may receive a similar illumination and thus have similar leakage currents, it need not necessarily be adjacent rows which are reversed. Thus for example the rows could be separated into pairs with adjacent pairs of rows having their photosensitive diodes oppositely oriented.

Figure 5:
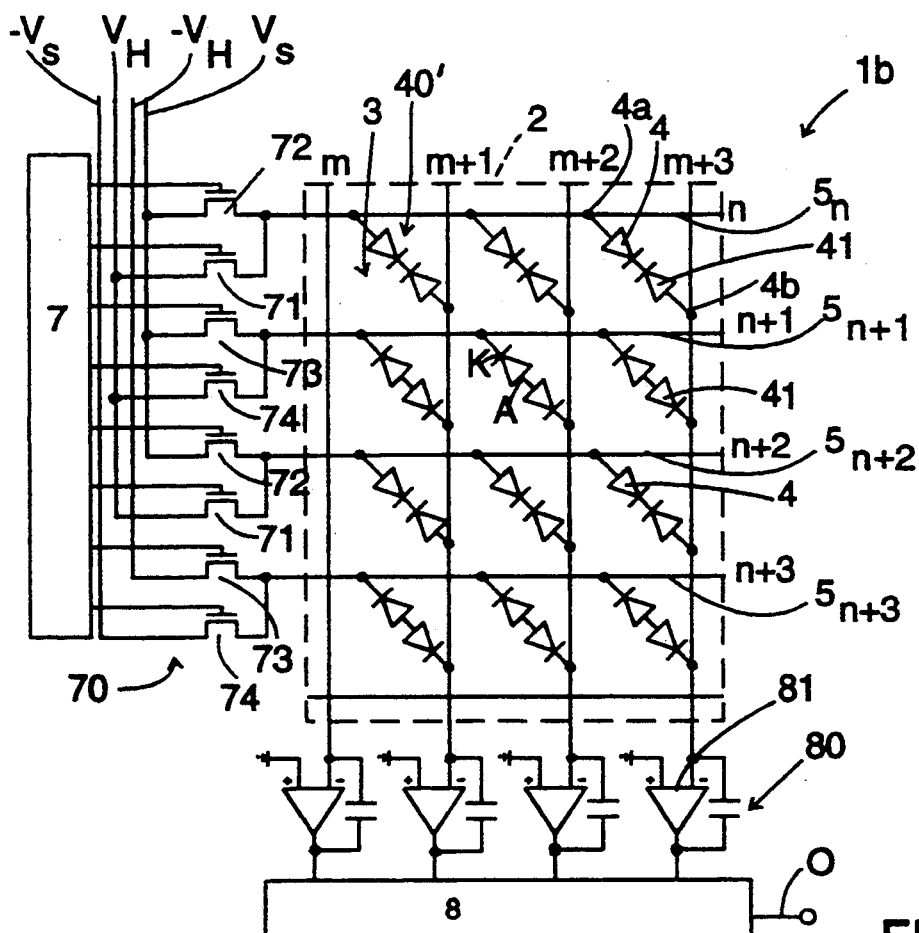
FIG. 5 is a schematic circuit diagram illustrating a second example of an image sensor in accordance with the invention.

FIG. 5 is a schematic circuit diagram similar to FIG. 1 of a second example of an image sensor in accordance with the invention.

The image sensor 1b illustrated in FIG. 5 differs from the image sensor 1a in that each pixel or imaging element 3' of the image sensor 1b comprises a two terminal component 40' consisting of two back-to-back rectifying elements, generally diodes, one of which forms the photosensitive diode 4 and the other of which forms a switching diode 41.

As before, the photosensitive diodes in alternate rows are oppositely oriented. Thus, in the first set S1 of rows n, n+2 ... the photosensitive diodes 4 each have their anode electrode A connected to the associated row conductor 5 and their cathode electrode K connected to the cathode electrode K of the associated switching diode 40 which has its anode electrode A connected to the associated column electrode 6. In the second set S2 of rows n+1, n+3 the photosensitive diodes 4 each have their cathode electrode K connected to the associated row conductor 5 and their anode electrode A connected to the anode electrode A of the associated switching diode 40 which has its cathode electrode K connected to the associated column electrode 6.

Although FIG. 5 shows the photosensitive diodes 4 as being directly connected directly to the row conductors 5, this need not necessarily be the case, for example the positions of the photosensitive diode 4 and associated switching diode 41 may be reversed so that the photosensitive diode 4 is coupled to the row conductor by the switching diode 41.

The image sensor 1b may be formed in a manner similar to the image sensor 1a and, for example, the array 2 may be formed by thin film technology on a substrate in a manner similar to that described above with reference to FIGS. 2a and 2b for the image sensor 1a.

Figure 6A:
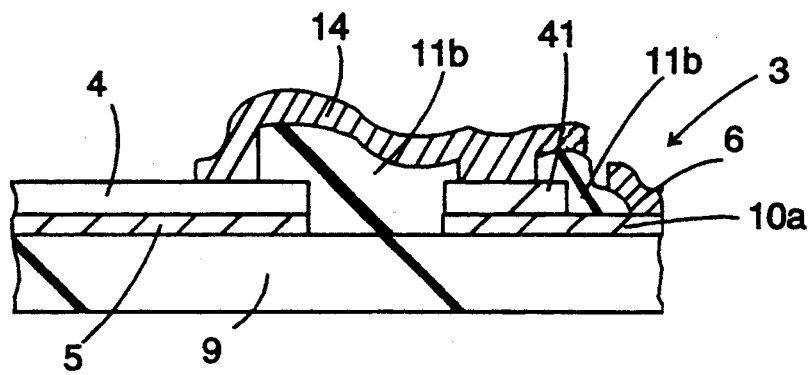
FIGS. 6a and 6b are cross-sectional views through parts of imaging elements of adjacent rows.

FIG. 6a shows a cross-sectional view through part of a pixel 3 of one of the second set S2 of rows n+1, n+3 ... where the anode electrodes A of each photosensitive diode 4 and associated switching element 41 are connected together.

In this example, the first conductive layer is patterned to define at least part of the row conductors 5 and an electrode 10a of the switching diode 41. The photosensitive and switching diodes 4 and 41 are then formed in a manner similar to that described above with reference to FIG. 2a by providing first an n conductivity then an intrinsic and finally a p conductivity layer and then patterning these layers to define the separate diode structures with the photosensitive diodes 4 being formed on top of the row conductors 5.

After deposition and patterning of the insulator layer, the second conductive layer is deposited and patterned to define at least part of each column conductor 6 and an electrode 14 connecting the anode electrodes A of each photosensitive diode 4 with the anode electrode of the associated switching diode 41. Each column conductor 6 also makes contact with the electrode 10a that of course forms the cathode electrode K of the switching diode 41.

As described above with reference to FIG. 2b, the imaging elements or pixels 3 in the first set S1 of rows in which the orientations of the diodes 4 and 41 are reversed so that their cathodes are connected could be constructed by using appropriate masks during the formation of the amorphous silicon layers so that the actual diodes are formed as p-i-n rather than n-i-p-structures. As one possible alternative as illustrated in FIG. 6b, the diodes may remain as n-i-p diodes and the metallisation pattern adjusted so that both diodes 4 and 41 are formed upon an electrode 10c defined from the first conductive layer and so that the second conductive layer defines the column conductors 6 which contact the anodes of the associated switching diodes 41 and an electrode 14a joins the anode of each photosensitive diode 41 to the associated row conductor 5.

Figure 7:
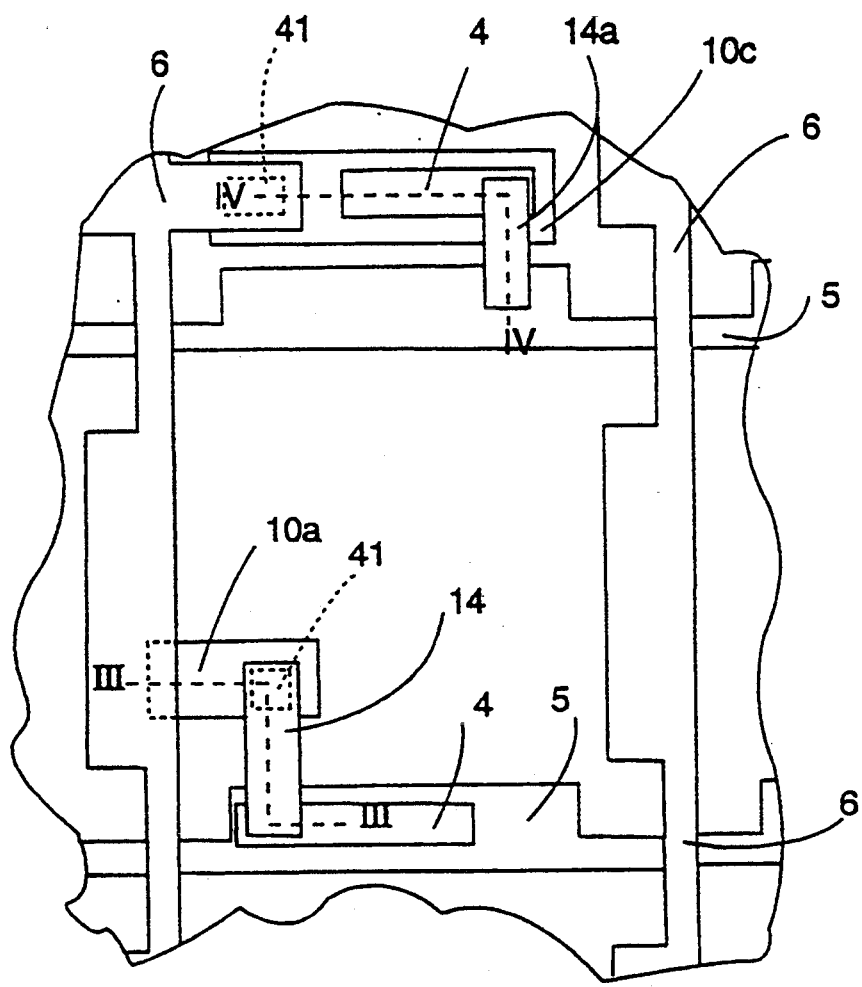
FIG. 7 is a plan view of one imaging element for each of two adjacent rows of the image sensor shown in FIG. 5 for illustrating a possible layout for the image sensor shown in FIG. 5.

FIG. 7 illustrates schematically one possible layout for the image sensor 1b.

Figure 6B:
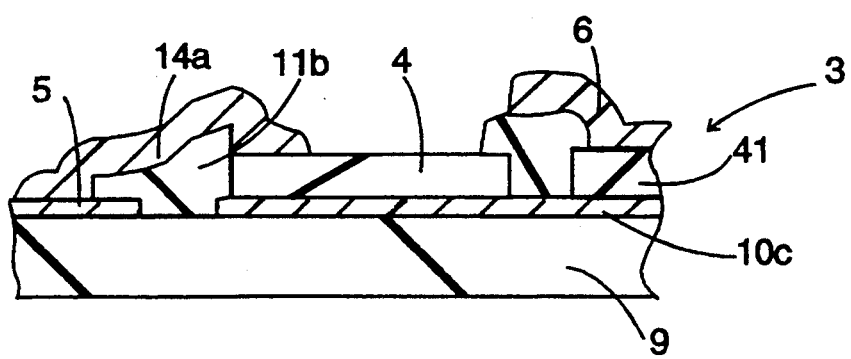

In FIG. 7, the lines III—III and IV—IV illustrate the respective directions in which the cross-sections shown in FIGS. 6a and 6b are taken.

As will be appreciated from FIG. 7, the photosensitive diodes 4 of the second set S2 of rows n+1, n+3 . . . can be formed on top of the row conductors 5 but the photosensitive diodes 4 of the first set S1 of rows n, n+2 . . . need to occupy a portion of the area bounded by the row and column conductors 5 and 6.

The operation of the image sensor 1b illustrated in FIGS. 5 to 7 is similar to that of the image sensor 1a except that the capacitance C of the capacitor C is replaced by the capacitance $C_S$ of the switching diode 41 in equations 1) to 7) and 1') to 7') above.

Although in the examples described above, first and second sets S1 and S2 to which the alternate polarity voltages are applied consist of alternate row 5, this need not necessarily be the case. Of course it is desirable for there to be equal numbers of rows in each set for example two or more adjacent rows 5 may be in the same set. An arrangement in which alternate rows 5 are in different sets has advantages in that adjacent pixels or imaging elements 3 or 3' are more likely to receive similar levels of light intensity and thus produce similar leakage currents.

In the examples described above, the photosensitive rectifying devices 4 (and switching devices 41 if present) are described as being formed as thin film p-i-n diodes. However, other forms of diodes such as Schottky or even bulk semiconductor diodes could be used. Also, the photosensitive devices need not necessarily be rectifying devices but could be for example non linear resistive devices such as thin film diodes (MIMs). In the latter case, the orientation of the MIM devices is of course not relevant. What is of course important is that opposite polarity voltages are applied to the first and second sets S1 and S2 in a manner similar to that described above.

Figure 8:
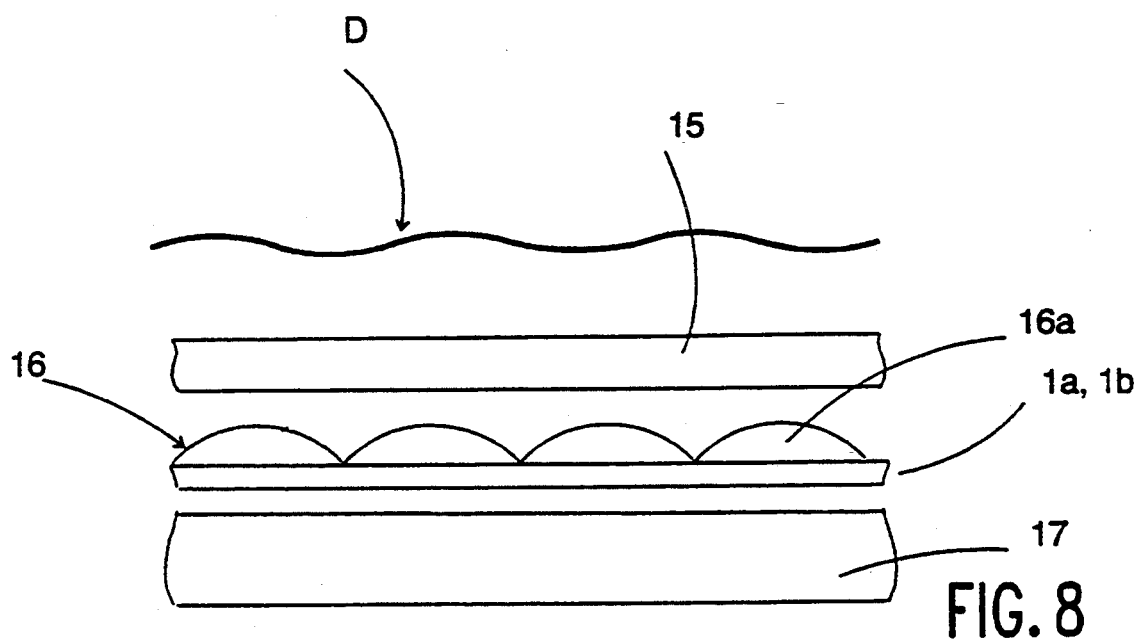
FIG. 8 is a diagrammatic cross-sectional view of part of a device incorporating an image sensor in accordance with the invention.

An image sensor in accordance with the invention may be used in any suitable application, for example as an optical or inert card for storage of optically input data, as an input device for, for example an image scanner or in a multi-function display. In the latter case, the photosensitive rectifying devices may be integrated within the display which may be for example an LCD (Liquid Crystal Display) device. Where the array 2 is, as indicated above, substantially transparent, then, as illustrated schematically in FIG. 8, the image sensor could simply be provided either on top of or, as shown behind, the display device 15 which is illuminated by a back light 17.

Such an arrangement may be used to form an image of a document D placed onto the LCD, allowing the image to be later displayed upon the LCD display or to allow the input of information to a modification of information on the display using, for example, a light pen or the like.

In such an arrangement where the image sensor is spaced from the document D to be imaged then a microlens array 16 may be provided on the image sensor 1a, 1b. Such a microlens array may be formed by any suitable method. For example, the lens elements 16a may be formed as described in EP-A-154962 by doping the appropriate areas of a substrate 15b to define areas of altered refractive index or by defining Fresnel lens elements on the substrate in the manner described in EP-A-154962. It is, however, preferred in the present example that the lens elements 15a be manufactured by coating the substrate 15b with a layer of photosensitive resist, exposing and then developing the resist to define an array of circular mask areas each at the desired location of a lens and then heating the resultant structure to about 140° C. (degrees Celcius) at which temperature the resist melts and is drawn by surface tension into a lens shape. Such a technique is described, along with others, in a review article by Mike Hutley, Richard Stevens and Dan Daly entitled "Microlens Arrays" and published in Physics World July 1991 at pages 27 to 32. The original thickness of the resist determines the focal length of the lens elements 6.

An image sensor in accordance with the invention could also comprise an X-ray detector in which case an electromagnetic conversion layer such as a phosphor layer would be provided over the array.

From reading the present disclosure, other modifications and variations will be apparent to persons skilled in the art. Such modifications and variations may involve other features which are already known in the semiconductor art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. An image sensor comprising a two-dimensional array of imaging elements arranged in rows and columns with each imaging element comprising a two terminal component for sensing light incident on the imaging element and for storing charge representing the incident light and a plurality of row and column conductors with one of the two terminals of each component in a row being coupled to the associated row conductor and the other one of the two terminals being coupled to the associated column conductor, and means for applying voltage signals to the row and column conductors for enabling light incident on the array to be sensed and to enable charge stored at a selected imaging element to be sensed, characterized in that the rows of imaging elements are arranged in first and second sets and in that the means for applying voltage signals to the row and column conductors comprises means for applying a voltage of one polarity to a row conductor associated with the first set to enable charge stored at an imaging element in the associated row to be sensed and for applying a voltage of the opposite polarity to a row conductor associated with the second set to enable charge stored at an imaging element in the associated row to be sensed.

2. An image sensor according to claim 1, wherein the first and second sets comprise equal numbers of rows of imaging elements.

3. An image sensor according to claim 1, wherein the first set consists of alternate rows of imaging elements and the second set consists of the remaining rows of imaging elements.

4. An image sensor according to claim 1, wherein each two-terminal component comprises a photosensitive rectifying device having an anode electrode and a cathode electrode and the anode electrodes of the photosensitive rectifying devices of the rows of imaging elements in the first set are coupled to the associated row conductor while the cathode electrodes of the photosensitive rectifying devices of the rows of imaging elements in the second set are coupled to the associated row conductor.

5. An image sensor according to claim 4, wherein each two-terminal component comprises a photosensitive diode in series with a capacitor.

6. An image sensor according to claim 4, wherein each imaging element comprises first and second rectifying devices coupled back to back with the first rectifying devices forming the photosensitive rectifying devices and so that the cathode electrodes of the first and second rectifying devices of an imaging element in one of the first and second sets are coupled together while the anode electrodes of the first and second rectifying devices of an imaging element in the other of the first and second sets are coupled together.

7. An image sensor according to claim 6, wherein the first and second rectifying devices comprise diodes with the first rectifying devices being photosensitive diodes.

8. An image sensor according to claim 4, wherein at least some of the photosensitive devices are formed on the associated row or column conductor.

9. An image sensor according to claim 1, wherein the array is formed using thin film technology.

* * * * *